(12) United States Patent
Aoki et al.

(10) Patent No.: US 8,901,633 B2
(45) Date of Patent: Dec. 2, 2014

(54) SEMICONDUCTOR STORAGE DEVICE AND METHOD FOR MANUFACTURING THE SAME

(71) Applicant: Kabushiki Kaisha Toshiba, Minato-ku, Tokyo (JP)

(72) Inventors: Nobutoshi Aoki, Yokohama (JP); Masaki Kondo, Kawasaki (JP); Takashi Izumida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/773,417

(22) Filed: Feb. 21, 2013

(65) Prior Publication Data

US 2014/0084356 A1   Mar. 27, 2014

(30) Foreign Application Priority Data

Sep. 21, 2012 (JP) ................................. 2012-208265

(51) Int. Cl.
| | |
|---|---|
| *H01L 29/78* | (2006.01) |
| *H01L 29/792* | (2006.01) |
| *H01L 21/28* | (2006.01) |
| *H01L 29/788* | (2006.01) |
| *H01L 27/115* | (2006.01) |
| *G11C 16/04* | (2006.01) |

(52) U.S. Cl.
CPC ........ *H01L 29/792* (2013.01); *H01L 21/28282* (2013.01); *H01L 21/28273* (2013.01); *H01L 29/7883* (2013.01); *H01L 27/11524* (2013.01); *H01L 27/1157* (2013.01); *G11C 16/0441* (2013.01)
USPC ........... 257/315; 257/316; 257/324; 257/326; 257/E29.309

(58) Field of Classification Search
CPC .......... H01I 29/51; H01I 29/78; H01I 29/778; H01I 29/7783
USPC .................... 257/315, 316, 324, 326, E29.309
See application file for complete search history.

(56) References Cited

U.S. PATENT DOCUMENTS 6,936,884 B2 *   8/2005   Chae et al. ..................... 257/315
7,535,049 B2 *   5/2009   Kim et al. ..................... 257/315

(Continued)

FOREIGN PATENT DOCUMENTS

| JP | 2007-250974 A | 9/2007 |
|---|---|---|
| JP | 2008-311325 A | 12/2008 |

(Continued)

OTHER PUBLICATIONS

Akira Goda et al.: "Scaling Directions for 2D and 3D NAND Cells": International device meeting 2012 Technical Digest: pp. 2.1.1-2.1.4 (in English).

*Primary Examiner* — Earl Taylor
*Assistant Examiner* — Stephen C Smith
(74) *Attorney, Agent, or Firm* — Holtz, Holtz, Goodman & Chick PC

(57) ABSTRACT

According to one embodiment, a semiconductor storage device includes a first insulating film formed on a substrate and functioning as a FN (Fowler-Nordheim) tunnel film, a first floating gate formed on the first insulating film, an inter-floating-gate insulating layer formed on the first floating gate and functioning as a FN tunnel film, a second floating gate formed on the inter-floating-gate insulating layer, a second insulating film formed on the second floating gate, and a control gate formed on the second insulating film. The inter-floating-gate insulating layer includes a third insulating film and a fourth insulating film having a charge trap property which are stacked.

11 Claims, 4 Drawing Sheets

(56) References Cited

U.S. PATENT DOCUMENTS

| | | |
|---|---|---|
| 7,968,406 B2 | 6/2011 | Ramaswamy et al. |
| 8,183,110 B2 | 5/2012 | Ramaswamy et al. |
| 8,289,782 B2 | 10/2012 | Izumida et al. |
| 8,354,706 B2 | 1/2013 | Kanemura et al. |
| 8,610,196 B2 * | 12/2013 | Tanamoto et al. ............ 257/315 |
| 2007/0045711 A1 * | 3/2007 | Bhattacharyya ............... 257/315 |
| 2009/0014774 A1 | 1/2009 | Ono |
| 2009/0173934 A1 * | 7/2009 | Jain ................................. 257/20 |
| 2012/0175696 A1 * | 7/2012 | Franzon et al. ............... 257/316 |

FOREIGN PATENT DOCUMENTS

| | | |
|---|---|---|
| JP | 2011-114034 A | 6/2011 |
| JP | 2011-114057 A | 6/2011 |
| JP | 2011-142246 A | 7/2011 |

* cited by examiner

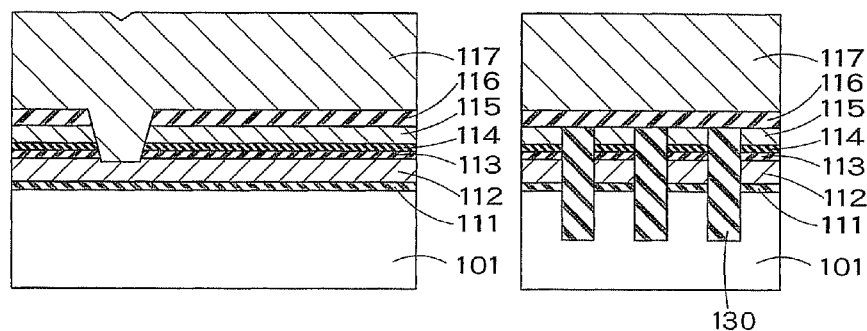
F I G. 6A    F I G. 6B
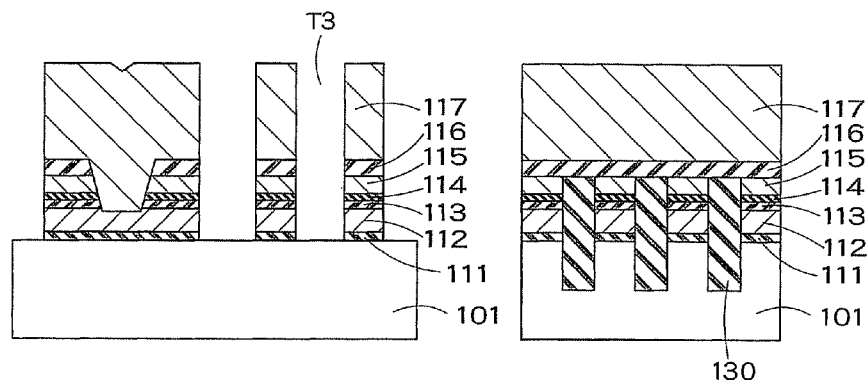
F I G. 7A    F I G. 7B
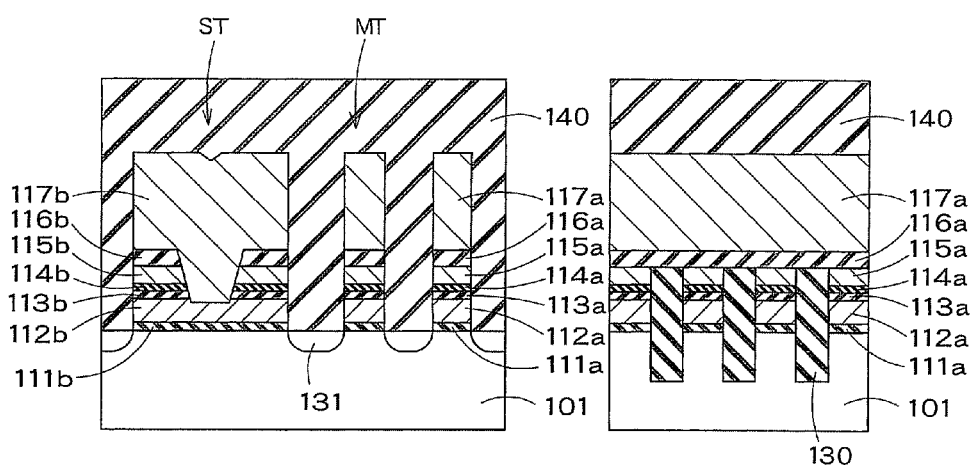
F I G. 8A    F I G. 8B

SEMICONDUCTOR STORAGE DEVICE AND METHOD FOR MANUFACTURING THE SAME

CROSS REFERENCE TO RELATED APPLICATION

This application is based upon and claims benefit of priority from the Japanese Patent Application No. 2012-208265, filed on Sep. 21, 2012, the entire contents of which are incorporated herein by reference.

FIELD

Embodiments described herein relate generally to a semiconductor storage device and a method for manufacturing the same.

BACKGROUND

There is proposed a semiconductor storage device such as NAND flash memory in which floating gates at a memory cell transistor include a lower floating gate, an upper floating gate, and an intergate insulating film provided between the lower floating gate and the upper floating gate. The charge holding property can be enhanced due to such a structure.

However, in the semiconductor storage device with the above-described structure, the intergate insulating film provided between the lower floating gate and the upper floating gate is so thick that transmission of charges due to FN (Fowler-Nordheim) tunneling is dominant, and thus there is a problem that a tunnel current cannot be increased and the write property or erase property is deteriorated.

BRIEF DESCRIPTION OF THE DRAWINGS

FIGS. 6A and 6B are cross-section views subsequent to FIGS. 5A and 5B;

FIGS. 7A and 7B are cross-section views subsequent to FIGS. 6A and 6B;

FIGS. 8A and 8B are cross-section views subsequent to FIGS. 7A and 7B;

DETAILED DESCRIPTION

According to one embodiment, a semiconductor storage device includes a first insulating film formed on a substrate and functioning as a FN (Fowler-Nordheim) tunnel film, a first floating gate formed on the first insulating film, an inter-floating-gate insulating layer formed on the first floating gate and functioning as a FN tunnel film, a second floating gate formed on the inter-floating-gate insulating layer, a second insulating film formed on the second floating gate, and a control gate formed on the second insulating film. The inter-floating-gate insulating layer includes a third insulating film and a fourth insulating film having a charge trap property which are stacked.

Embodiments will now be explained with reference to the accompanying drawings.

First Embodiment

Figure 1:
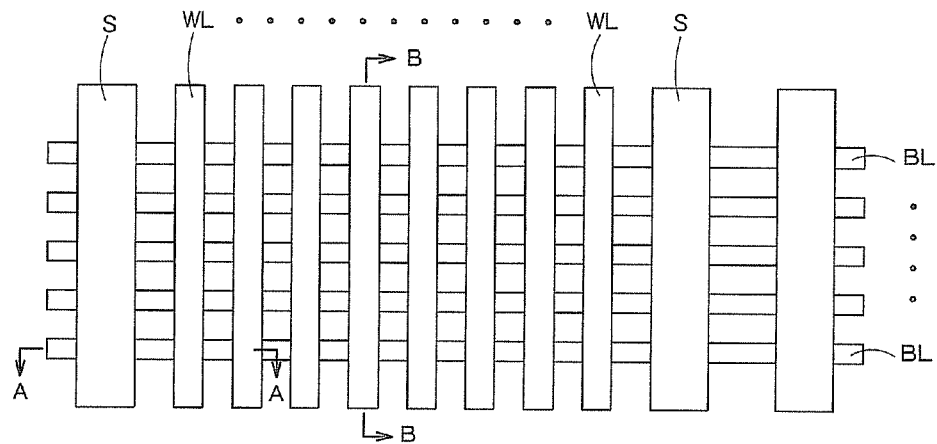
FIG. 1 is a plan view of a semiconductor storage device according to a first embodiment.

FIG. 1 is a plan view of a semiconductor storage device according to a first embodiment. The semiconductor storage device is a NAND flash memory.

As illustrated in FIG. 1, the semiconductor storage device is provided with a plurality of bit lines BL extending in a first direction and a plurality of word lines WL and select lines S extending in a second direction perpendicular to the first direction.

A memory cell transistor is provided at the intersection between the bit line BL and the word line WL. A select transistor is provided at the intersection between the bit line BL and the select line S. The memory cell transistor is electrically connected to the bit line BL and the word line WL. The select transistor is electrically connected to the bit line BL and the select line S.

Figures 2A, 2B:
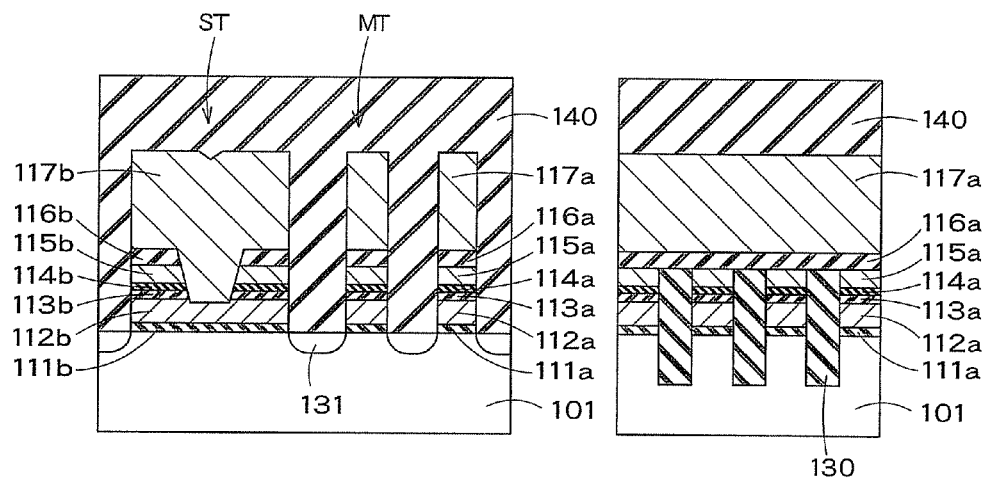
FIGS. 2A and 2B are cross-section views of the semiconductor storage device according to the first embodiment.

FIG. 2A illustrates a longitudinal cross-section taken along line A-A of FIG. 1, and FIG. 2B illustrates part of the longitudinal cross-section taken along line B-B of FIG. 1.

As illustrated in FIG. 2A, an impurity diffusion layer 131 is formed on the surface of a semiconductor substrate 101. The semiconductor substrate 101 between the impurity diffusion layers 131 is formed thereon with a memory cell transistor MT in which a tunnel insulating film 111a, a lower floating gate 112a, an IFD (Inter Floating-Gate Dielectric) film 113a, an ICT (Interfacial Charge Trap) film 114a, an upper floating gate 115a, an IPD (Inter Poly-Si Dielectric) film 116a, and a control gate 117a are stacked in this order. The memory cell transistor MT has a two-layer structure in which the floating gates sandwich the IFD film 113a and the ICT film 114a.

As illustrated in FIG. 2B, the memory cell transistor MT is formed with a plurality of embedded-type device isolation regions 130 spaced at predetermined intervals on the semiconductor substrate 101 in the word line WL direction. The semiconductor substrate 101 between the device isolation regions 130 is formed thereon with the tunnel insulating film 111a, the lower floating gate 112a, the IFD film 113a, the ICT film 114a and the upper floating gate 115a in this order. The IPD film 116a is formed on the upper floating gate 115a and the device isolation region 130. The control gate 117a is formed on the IPD film 116a.

As illustrated in FIG. 1 and FIG. 2A, select transistors ST are formed at both ends of the memory cell transistors MT arranged in the bit line BL direction. The select transistor ST includes a tunnel insulating film 111b, a first electrode layer 112b, a first inter-electrode insulating film 113b, a second inter-electrode insulating film 114b, a second electrode layer 115b, a third inter-electrode insulating film 116b and a third electrode layer 117b stacked on the semiconductor substrate 101 in this order. The select transistor ST has the same structure as the memory cell transistor MT, and the tunnel insulating film 111b, the first electrode layer 112b, the first inter-electrode insulating film 113b, the second inter-electrode insulating film 114b, the second electrode layer 115b, the third inter-electrode insulating film 116b and the third electrode layer 117b in the select transistor ST correspond to the tunnel insulating film 111a, the lower floating gate 112a, the IFD film 113a, the ICT film 114a, the upper floating gate 115a, the IPD film 116a and the control gate 117a in the memory cell transistor MT, respectively.

In the select transistor ST, part of the first inter-electrode insulating film 113b, the second inter-electrode insulating film 114b, and the third inter-electrode insulating film 116b is formed with openings, and the first electrode layer 112b, the second electrode layer 115b and the third electrode layer 117b are connected with each other.

The tunnel insulating film 111a in the memory cell transistor MT functions as a FN (Fowler-Nordheim) tunnel film. The FN tunnel film is an insulating film having a thickness in which transmission of charges due to FN tunneling is dominant. For example, the thickness of the tunnel insulating film 111a is 3 nm or more, preferably 3 to 5 nm in EOT (Equivalent Oxide Thickness) or in silicon oxide thickness equivalent.

The lower floating gate 112a and the upper floating gate 115a are electrically disconnected from each other by the IFD film 113a and the ICT film 114a. In order to prevent the charges from directly tunneling between the lower floating gate 112a and the upper floating gate 115a, a total thickness of the IFD film 113a and the ICT film 114a is large enough to function as the FN tunnel film. Capacitive coupling between the lower floating gate 112a and the upper floating gate 115a is preferably increased. Thus, the IFD film 113a and the ICT film 114a are desirably insulating films with relatively high dielectric constants. When many trap levels are present, a tunnel probability increases due to the traps, and thus the IFD film 113a is desirably lower in trap density.

The IFD film 113a employs an aluminum oxide film such as $Al_2O_3$ film. Since the $Al_2O_3$ film has a higher dielectric than a $SiO_2$ film (approximately 2.6 times), a physical thickness can be increased in order to prevent direct tunneling. If a thickness of the $Al_2O_3$ film (dielectric of approximately 10) is assumed as 5 nm, the thickness in $SiO_2$ film equivalent (EOT equivalent) is approximately 2 nm. The $Al_2O_3$ film employs a film with a less trap property.

The ICT film 114a as an insulating film having a charge trap property (charge accumulating function) is formed on the IFD film 113a. The ICT film 114a is preferably thin enough to have shallow trap levels close to the conductive zone. The ICT film 114a employs a hafnium oxide film having a thickness of 1 nm such as $HfO_2$ film (dielectric of approximately 15).

In the above example, the total physical thickness of the IFD film 113a and the ICT film 114a is 6 nm and EOT is approximately 2.2 nm. Thus, the physical thickness capable of sufficiently reducing the direct tunneling probability and the small EOT capable of sufficiently increasing the capacitive coupling between the lower floating gate 112a and the upper floating gate 115a can be both achieved by the IFD film 113a and the ICT film 114a.

In the present embodiment, the ICT film 114a having a charge trap property is provided on the IFD film 113a. Thus, when an erase bias is applied to the control gate 117a, the electrons in the upper floating gate 115a are temporarily trapped in the ICT film 114a, and then transmit through the IFD film 113a by the FN tunnel to reach the lower floating gate 112a. In this way, when an erase bias is applied, the electrons can easily reach from the upper floating gate 115a to the lower floating gate 112a, thereby enhancing the erase property.

As described above, according to the present embodiment, the erase property can be enhanced while the charge holding property of the memory cell transistor MT can be secured.

A method for manufacturing the semiconductor storage device will be described below with reference to the step cross-section views illustrated in FIGS. 3A and 3B to 8A and 8B. FIGS. 3A to 8A correspond to FIG. 2A. FIGS. 3B to 8B correspond to FIG. 2B.

Figures 3A, 3B:
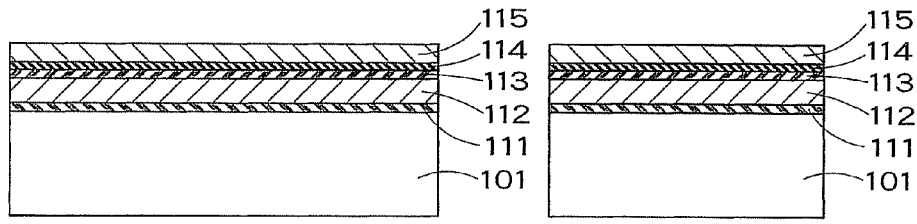
FIGS. 3A and 3B are cross-section views for explaining a method for manufacturing the semiconductor storage device according to the first embodiment.

At first, as illustrated in FIGS. 3A and 3B, a substrate 101 is formed thereon with an insulating film 111 as a material for the tunnel insulating films 111a, 111b, an electrode layer 112 as a material for the lower floating gate 112a and the first electrode layer 112b, an insulating film 113 as a material for the IFD film 113a and the first inter-electrode insulating film 113b, an insulating film 114 as a material for the ICT film 114a and the second inter-electrode insulating film 114b, and an electrode layer 115 as a material for the upper floating gate 115a and the second electrode layer 115b in this order.

The insulating film 111 is a silicon oxide film, a silicon oxynitride film or a silicon nitride film, for example. The electrode layers 112 and 115 are made of a metal material such as TiN. As described above, the insulating film 113 may employ an $Al_2O_3$ film and the insulating film 114 may employ a $HfO_2$ film.

Figures 4A, 4B:
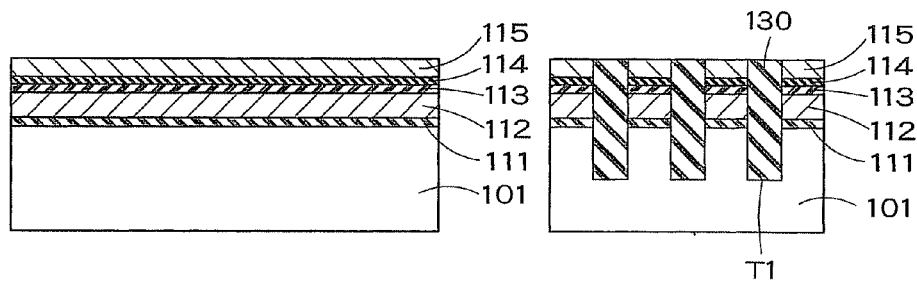
FIGS. 4A and 4B are cross-section views subsequent to FIGS. 3A and 3B.

Then, as illustrated in FIGS. 4A and 4B, a mask layer (not illustrated) is formed on the electrode layer 115 and the mask layer is patterned into a plurality of strips in the bit line BL direction by lithography and etching. The mask layer is a silicon oxide film, for example. Then, the patterned mask layer is used to etch the electrode layer 115, the insulating films 114, 113, the electrode layer 112, the insulating film 111 and the substrate 101, thereby forming a plurality of trenches T1. Then, the mask layer is removed, and an insulating film such as silicon oxide film is embedded in the trenches T1 and planarized by a CMP (chemical mechanical polishing) processing, thereby forming the device isolation regions 130.

Figures 5A, 5B:
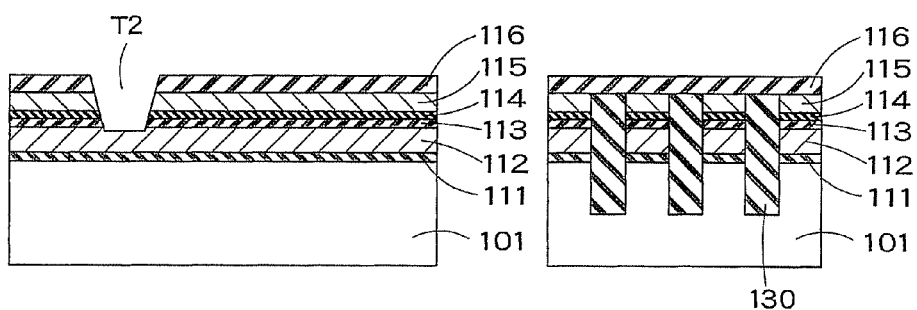
FIGS. 5A and 5B are cross-section views subsequent to FIGS. 4A and 4B.

Subsequently, as illustrated in FIGS. 5A and 5B, an insulating film 116 as a material for the IPD film 116a and the third inter-electrode insulating film 116b is formed on the electrode layer 115 and the device isolation region 130. The insulating film 116 is a silicon oxide film or silicon oxynitride film, a silicon nitride film, an $Al_2O_3$ film, a $HfO_x$ film, a $TaO_x$ film, or a $La_2O_x$ film, for example.

Then, in the region where the select transistor ST is provided, the insulating film 116, the electrode film 115, and the insulating films 114, 113 are removed by lithography and etching (such as RIE) to form a trench 2. At this time, the electrode layer 112 may be partially removed. The trench T2 corresponds to the openings provided in the first inter-electrode insulating film 113b, the second inter-electrode insulating film 114b and the third inter-electrode insulating film 116b in the select transistor ST.

Then, as illustrate din FIGS. 6A and 6B, an electrode layer 117 as a material for the control gate 117a and the third electrode layer 117b is formed on the insulating film 116. The trench T2 is embedded by the electrode layer 117. The electrode layer 117 is made of poly silicon, boron- or silicon-doped polysilicon, or metal such as TiN, TaN, W, Ni or Cl and its silicide.

Then, as illustrated in FIGS. 7A and 7B, a mask layer (not illustrated) is formed on the electrode layer 117 and the mask layer is patterned in a plurality of strips in the word line WL direction by lithography and etching. The patterned mask layer is used to etch the electrode layer 117, the insulating film 116, the electrode layer 115, the insulating film 114, the insulating film 113, the electrode layer 112 and the insulating film 111, thereby forming a plurality of trenches T3.

Then, as illustrated in FIGS. 8A and 8B, the impurity diffusion layer 131 is formed on the substrate 101. Then, an interlayer insulating film 140 is formed on the substrate 101 for embedding the trenches T3 therein. Thereafter, contact plugs, via plugs, wiring layers, and the like are formed.

Thereby, the memory cell transistor MT is formed, which stacks therein the tunnel insulating film 111a, the lower floating gate 112a, the IFD film 113a, the ICT film 114a, the upper floating gate 115a, the IPD film 116a and the control gate 117a, and which enhances the erase property while securing the charge holding property.

Second Embodiment

Figures 9A, 9B:
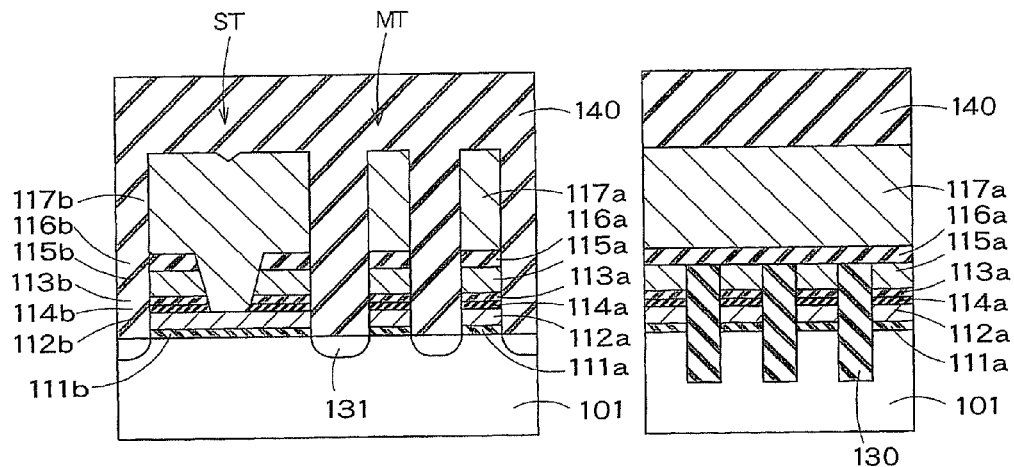
FIGS. 9A and 9B are cross-section views of a semiconductor storage device according to a second embodiment.

The ICT film 114a is formed on the IFD film 113a in the first embodiment, but as illustrated in FIGS. 9A and 9B, the ICT film 114a may be provided below the IFD film 113a, or between the lower floating gate 112a and the IFD film 113a.

With the structure, when a high positive voltage is applied to the control gate 117a during write, the electrons in the lower floating gate 112a are temporarily trapped in the ICT film 114a, and then transmit through the IFD film 113a by the FN tunnel and move to the upper floating gate 115a. In this way, when a write bias is applied, the ICT film 114a assists the tunnel effect so that a tunnel current increases and a write speed is enhanced.

In this way, the ICT film 114a is provided below the IFD film 113a so that the write property can be enhanced while the charge holding property of the memory cell transistor MT is secured.

Third Embodiment

Figures 10A, 10B:
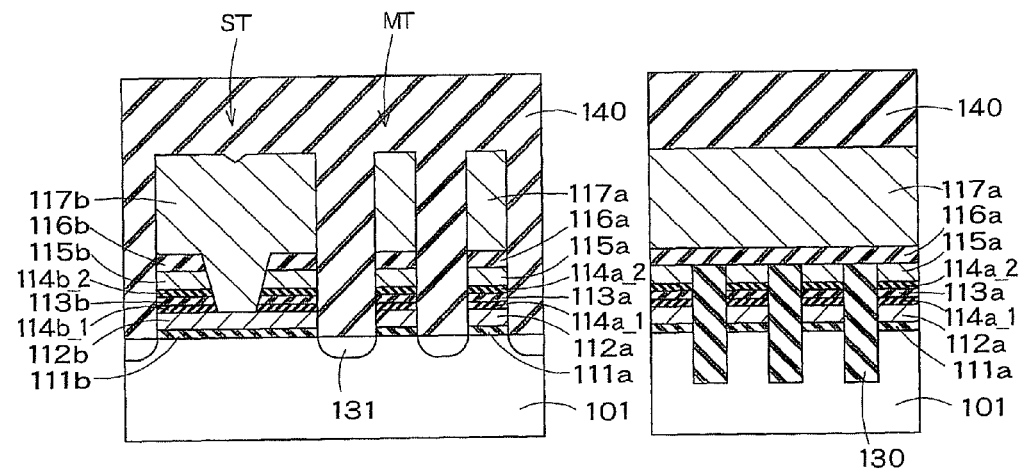
FIGS. 10A and 10B are cross-section views of a semiconductor storage device according to a third embodiment.

As illustrated in FIGS. 10A and 10B, the ICT films may be provided above and below the IFD film 113a. That is, an ICT film 114a_1 may be provided between the lower floating gate 112a and the IFD film 113a and an ICT film 114a_2 may be provided between the upper floating gate 115a and the IFD film 113a.

With the structure, when an erase bias is applied to the control gate 117a, the electrons in the upper floating gate 115a are temporarily trapped in the ICT film 114a_2, and then transmit through the IFD film 113a by the FN tunnel and reach the lower floating gate 112a. In this way, when an erase bias is applied, the electrons can easily reach from the upper floating gate 115a to the lower floating gate 112a, thereby enhancing the erase property.

During the write operation, the ICT film 114a_2 assists the tunnel effect so that a tunnel current increases and a write speed is enhanced.

Thus, according to the present embodiment, the erase property and the write property can be enhanced while securing the charge holding property of the memory cell transistor MT.

The first to third embodiments have described the case in which the IFD film 113a employs an $Al_2O_3$ film, but any insulating film which has at least a higher dielectric than $SiO_2$ film, is sufficiently small in trap level density, and is small in electric field leak may be employed. The IFD film 113a may stack therein a plurality of materials meeting a high dielectric and a low electric field leak (low trap density).

The first to third embodiments have described the case in which the ICT film 114a employs a $HfO_2$ film, but any insulating film having a shallow trap level may be employed.

When the $HfO_2$ film as the ICT film 114a is stacked on the $Al_2O_3$ film as the IFD film 113a, an Hf atom, an Al atom, O atoms and the like can diffuse depending on a thermal process. Thus, an anti-diffusion film may be provided between the $Al_2O_3$ film and the $HfO_2$ film. The anti-diffusion film may employ a SiN film having a thickness of 1 nm, for example. The anti-diffusion film is preferably small in trap level density.

The first to third embodiments may employ different materials for the IFD film 113a and the ICT film 114a, but after the $Al_2O_3$ film is formed to be the IFD film 113a, a large amount of nitrogen atoms may be introduced into the $Al_2O_3$ film surface by radical nitridation thereby to form a film with a trap property on the $Al_2O_3$ film surface.

The metal materials for the lower floating gate 112a and the upper floating gate 115a may be selected to meet a proper work function in consideration of the charge holding property of the memory cell transistor MT. The above embodiments have described the example in which the TiN film is employed in consideration of thermal resistance or easiness of machining, but any conductive materials such as single metals, alloys and metal oxide films may be employed.

In the above embodiments, as illustrated in FIGS. 2, 9 and 10, the third electrode layer 117b is connected to the second electrode layer 115b and the first electrode layer 112b in the select transistor ST, but it may not be connected to the first electrode layer 112b. In this case, in the step illustrated in FIG. 5A, the insulating film 116 is removed to form the trench T2, thereby exposing the electrode layer 115.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first insulating film formed on a substrate and functioning as a FN (Fowler-Nordheim) tunnel film;
   a first floating gate formed on the first insulating film;
   an inter-floating-gate insulating layer formed on the first floating gate and functioning as a FN tunnel film;
   a second floating gate formed on the inter-floating-gate insulating layer;
   a second insulating film formed on the second floating gate; and
   a control gate formed on the second insulating film,
   wherein the inter-floating-gate insulating layer includes a third insulating film and a fourth insulating film which has a charge trap property that are stacked,
   wherein the fourth insulating film is formed on the third insulating film, and
   wherein the third insulating film has a lower charge trap property than the charge trap property of the fourth insulating film.

2. The semiconductor storage device according to claim 1, wherein the inter-floating-gate insulating layer further includes an atom anti-diffusion film provided between the third insulating film and the fourth insulating film.

3. The semiconductor storage device according to claim 1, wherein the third insulating film is an aluminum oxide film and the fourth insulating film is a hafnium oxide film.

4. The semiconductor storage device according to claim 1, wherein the third insulating film has a higher dielectric than a $SiO_2$ film.

5. The semiconductor storage device according to claim 1, wherein a thickness of the first insulating film is 3 nm or more in EOT (Equivalent Oxide Thickness).

6. A semiconductor storage device comprising:
a first insulating film formed on a substrate and functioning as a FN (Fowler-Nordheim) tunnel film;
a first floating gate formed on the first insulating film;
an inter-floating-gate insulating layer formed on the first floating gate and functioning as a FN tunnel film;
a second floating gate formed on the inter-floating-gate insulating layer;
a second insulating film formed on the second floating gate; and
a control gate formed on the second insulating film,
wherein the inter-floating-gate insulating layer includes a third insulating film and a fourth insulating film which has a charge trap property that are stacked,
wherein the fourth insulating film is formed below the third insulating film, and
wherein the third insulating film has a lower charge trap property than the charge trap property of the fourth insulating film.

7. A semiconductor storage device comprising:
a first insulating film formed on a substrate and functioning as a FN (Fowler-Nordheim) tunnel film;
a first floating gate formed on the first insulating film;
an inter-floating-gate insulating layer formed on the first floating gate and functioning as a FN tunnel film;
a second floating gate formed on the inter-floating-gate insulating layer;
a second insulating film formed on the second floating gate; and
a control gate formed on the second insulating film,
wherein the inter-floating-gate insulating layer includes a third insulating film and a plurality of fourth insulating films which have a charge trap property that are stacked,
wherein a first one of the plurality of fourth insulating films is formed on the third insulating film and a second one of the plurality of fourth insulating films is formed below the third insulating film, and
wherein the third insulating film has a lower charge trap property than the charge trap property of each of the plurality of fourth insulating films.

8. The semiconductor storage device according to claim 7, wherein the inter-floating-gate insulating layer further includes an atom anti-diffusion film provided between the third insulating film and one of the first and second one of the plurality of fourth insulating films.

9. The semiconductor storage device according to claim 7, wherein the third insulating film is an aluminum oxide film and each of the plurality of fourth insulating films is a hafnium oxide film.

10. The semiconductor storage device according to claim 7, wherein the third insulating film has a higher dielectric than a $SiO_2$ film.

11. The semiconductor storage device according to claim 7, wherein a thickness of the first insulating film is 3 nm or more in EOT (Equivalent Oxide Thickness).

* * * * *